US006934156B2

(12) United States Patent
Canova et al.

(10) Patent No.: US 6,934,156 B2
(45) Date of Patent: Aug. 23, 2005

(54) ELECTRIC-POWER SUPPLY WITH RECTIFIER

(75) Inventors: Antonio Canova, Arezzo (IT); Mauro Piazzesi, Arezzo (IT)

(73) Assignee: MagneTek S.p.A.

( * ) Notice: Subject to any disclaimer, the term of this patent is extended or adjusted under 35 U.S.C. 154(b) by 164 days.

(21) Appl. No.: 10/462,934

(22) Filed: Jun. 17, 2003

(65) Prior Publication Data

US 2003/0231450 A1 Dec. 18, 2003

(51) Int. Cl.$^7$ ............................. H05K 7/20; H02B 1/20
(52) U.S. Cl. ...................... 361/704; 361/611; 361/637; 363/141
(58) Field of Search ................................. 361/688, 704, 361/719, 611, 637, 648; 363/141

(56) References Cited

U.S. PATENT DOCUMENTS

| | | | | |
|---|---|---|---|---|
| 5,602,451 A | * | 2/1997 | Kohge et al. ............... | 318/293 |
| 5,623,399 A | * | 4/1997 | Ishii et al. .................. | 363/132 |
| 5,729,450 A | * | 3/1998 | Dimino et al. .............. | 363/132 |
| 5,969,938 A | | 10/1999 | Byrne et al. ................ | 361/678 |
| 6,166,937 A | * | 12/2000 | Yamamura et al. ......... | 363/141 |
| 6,326,761 B1 | * | 12/2001 | Tareilus ..................... | 318/722 |

FOREIGN PATENT DOCUMENTS

EP 0 735 810 A2 10/1996

OTHER PUBLICATIONS

Patent Abstract of Japan Publication No. 9,259,985, published Oct. 3, 1997 to Yamazaki Harutake, Inventor.

* cited by examiner

*Primary Examiner*—Boris Chervinsky
(74) *Attorney, Agent, or Firm*—Waddey & Patterson; Mark J. Patterson (57) ABSTRACT

An electric-power supply incorporates an electronic card with at least one rectifier and one output line of the rectifier. The output line is formed of at least one first bar made of conductive material, terminating with one first output end, and at least one second bar made of conductive material, terminating with one second output end. The two output ends form the positive and negative output poles of the power supply for connection to a load. Means are provided for electrical and mechanical connection for the first bar and the second bar to the card, and on at least one of the two bars is carried at least one electronic component of said rectifier.

24 Claims, 9 Drawing Sheets

ELECTRIC-POWER SUPPLY WITH RECTIFIER

This application claims benefit of co-pending European Patent Application Ser. No. 02425390.8 filed Jun. 17, 2002, entitled "Electric-Power Supply with Rectifier" which is hereby incorporated by reference.

Be it known that we, Antonio Canova, a citizen of Italy, residing at Via Po 79/4, 52925 Montevarchi, Arezzo Italy; Mauro Piazzesi, a citizen of Italy, residing at Via E. Tarantelli 4, 52028 Terranuova Bracciolini, Arezzo Italy; have invented a new and useful "Electric-Power Supply with Rectifier."

BACKGROUND OF THE INVENTION

The present invention relates to an electric-power supply comprising a rectifier and an output line for the connection of the rectifier to a load.

One of the difficulties in making electric-power supplies of this type is the wiring, i.e., the connection of the various output components set between the rectifier proper and the positive and negative connections to the load.

SUMMARY OF THE INVENTION

The purpose of the present invention is to provide an electric-power supply in which the electronic components and the electrical power connections at output from the rectifier assume a particularly simple conformation, with simplification in the fabrication process, reduction in the overall dimensions, as well as reduction in the costs of construction and in electromagnetic emissions.

Basically, according to the invention it is envisaged that the output line from the rectifier comprises at least one first board or bar made of conductive material, which terminates with one first output end, and at least one second bar made of conductive material, which terminates with a second output end, in which the first and the second output ends of the above bars constitute the output poles, positive and negative respectively, of the power supply for connection to the load. According to the invention, there are moreover provided means of electrical and mechanical connection of the two bars to the card, and carried on at least one of the two bars there is at least one of the electronic components provided on the output side of the rectifier. The bars form the conductors for the passage of current from the rectifier to the load.

As will appear clearly from the description of an example of embodiment, with a configuration of this type it is possible to obtain a neat assembly of the electronic components at output from the rectifier, with substantial reduction in the overall dimensions and drastic simplification of the assembly of the various components.

In practice, the first and the second bars and possible further bars forming the output lines of the rectifier develop in planes orthogonal to the electronic card that carries the components of the power supply. Each bar can have various portions not necessarily lying in the same plane, but in general each portion making up each bar lies in a plane orthogonal to the plane of the electronic card.

The first of the bars extends advantageously from the output end of the power supply up to output diodes of the rectifier. This bar can be rectilinear. At the end corresponding to the position of the output diodes of the rectifier, the first bar can be constrained both electrically and mechanically to the diodes and to the electronic card by means of at least one bracket for mechanical and electrical connection, and preferably by means of two connection brackets.

The first bar can advantageously carry a current sensor, for example a Hall sensor, which surrounds the bar itself. In this case, the current sensor constitutes one of the electronic components carried by the bars.

In an advantageous embodiment of the invention, the power supply comprises a third bar made of conductive material, which also advantageously develops in one or more planes orthogonal to the plane of the electronic card carrying the components of the power supply. The second bar and the third bar form part of the positive side of the output of the power supply.

To simplify the operations of assembly, the third bar can be advantageously constrained mechanically to the first bar, for example by providing on the first bar and on the third bar portions or stretches set alongside one another and joined together mechanically. The two stretches set alongside one another of the two bars can be advantageously planar, and between them there is set a layer of insulating material.

The third bar is appropriately and advantageously constrained to at least one bracket for mechanical and electrical connection to the electronic card. In this way, the third bar is electrically connected to the output capacitors of the rectifier.

Advantageously, according to a preferred embodiment of the invention, around the area of the first bar and of the third bar, where the mechanical connection between them is located, there is set a common choke. This choke constitutes a further electronic component carried by the bars that form the output line of the power supply. This configuration further simplifies the construction of the various components and their assembly.

When the rectifier envisages means for interrupting the supply in order to insulate the rectifier from the load in the event of a failure, it is necessary to provide a heatsink that removes the heat generated inside the means for interrupting the supply. Said means can be constituted by diodes, by MOSFETs or by other equivalent means. According to a particularly advantageous embodiment of the invention, the heatsink in thermal contact with the means for interrupting the supply is formed by a portion of one of the bars that make up the output of the rectifier and in particular by a portion of the third bar. Since the heatsink is constituted by the bar, it will also form an electrical connection with the means for interrupting the supply. In this way, the configuration of the device is further simplified, reducing the components that make it up and enabling a pre-assembly of a fair number of them and hence simplifying the operation of assembly on the electronic card.

In a possible embodiment, one or more output fuses can be carried by one of the bars that form the output line of the power supply. The fuse or fuses are further connected, both mechanically and electrically, to the electronic card by means of one or more connection brackets.

Further advantageous characteristics and embodiments of the invention are indicated in the attached claims.

DESCRIPTION OF THE PREFERRED EMBODIMENTS

Figure 1:
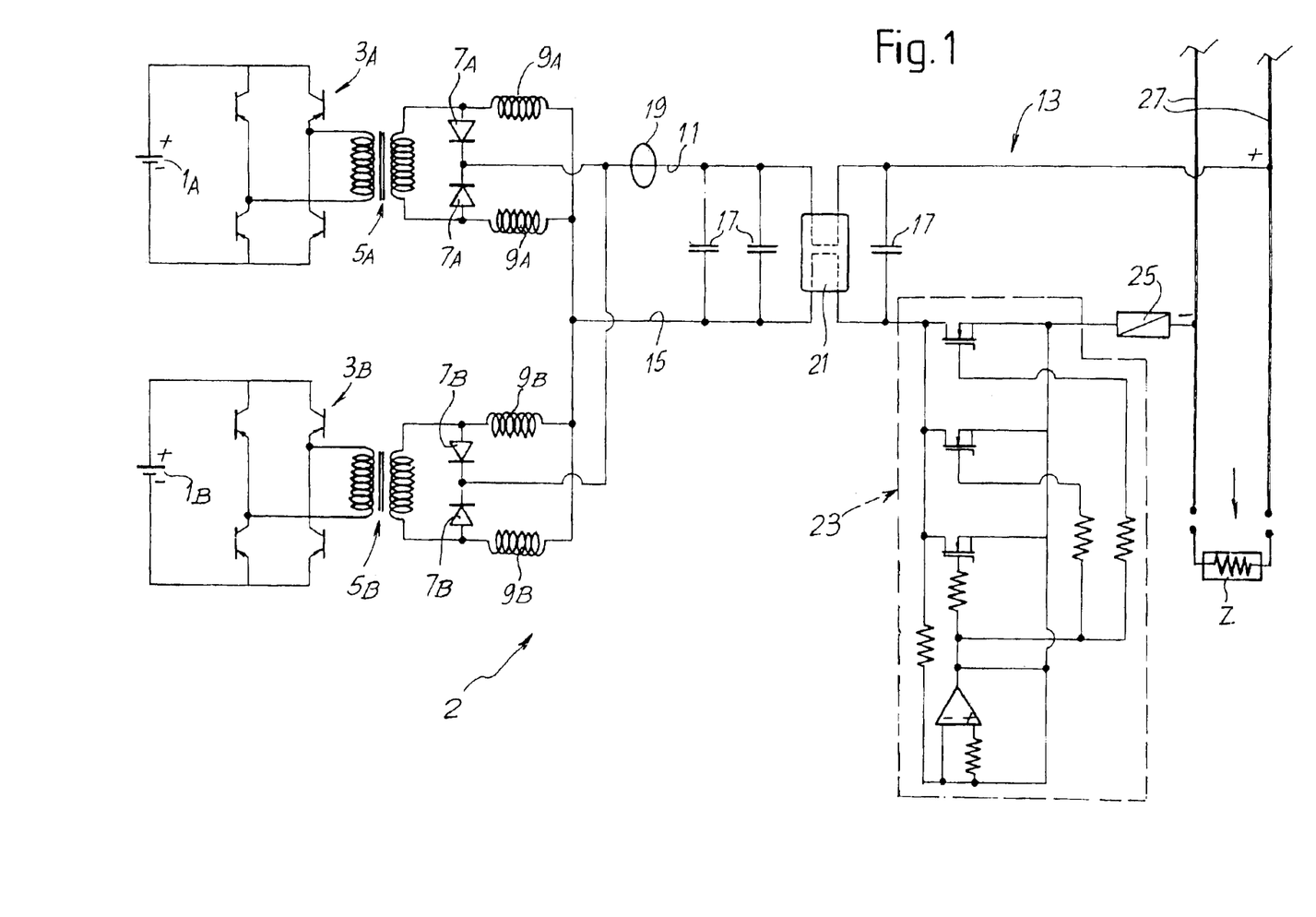
FIG. 1 illustrates a simplified electronic diagram of the power supply.
Figure 2:
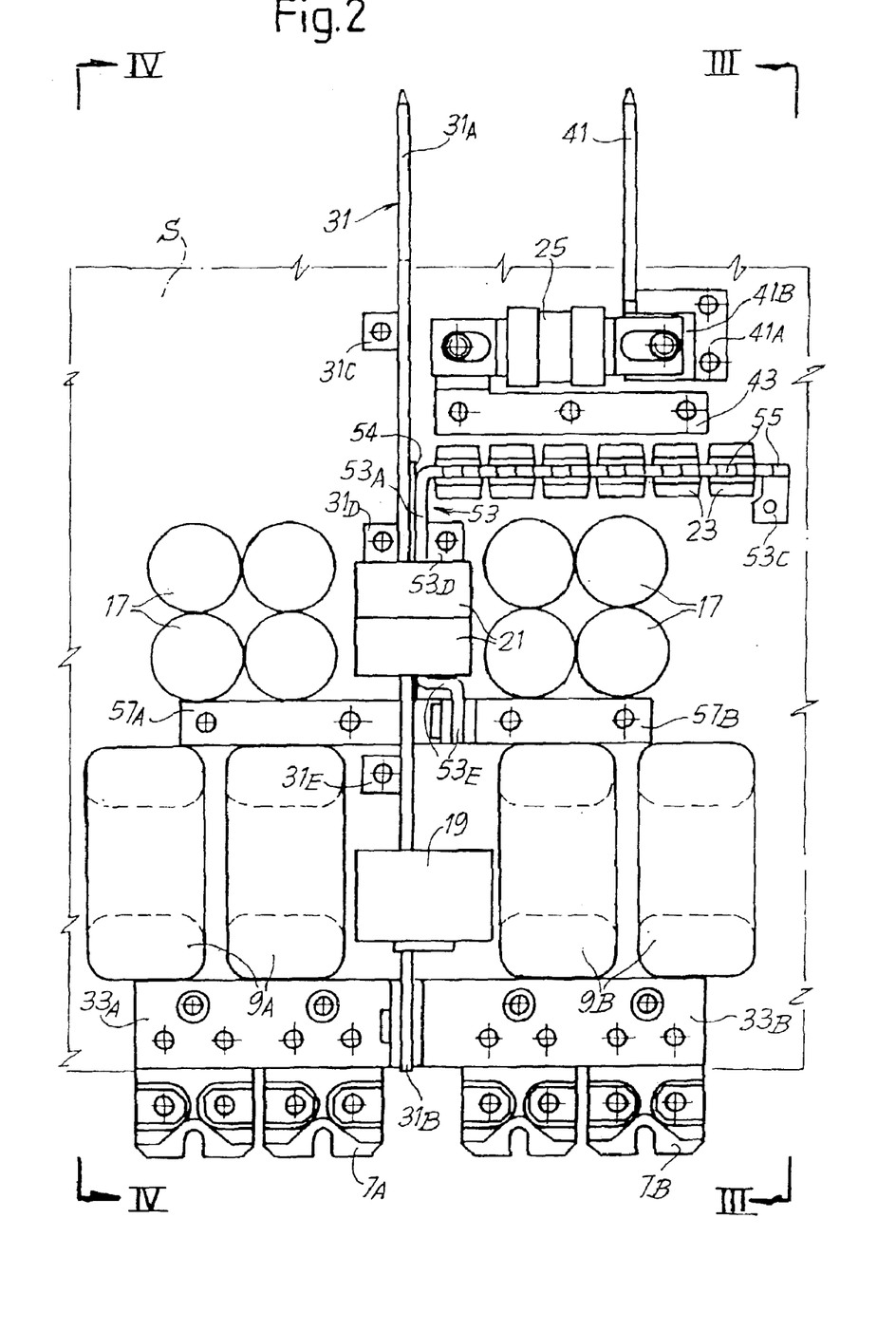
FIG. 2 illustrates a plan view, according to the plane indicated by II—II of FIGS. 3 and 4, of the output components of the rectifier, with the bars forming the output line.
Figure 3:
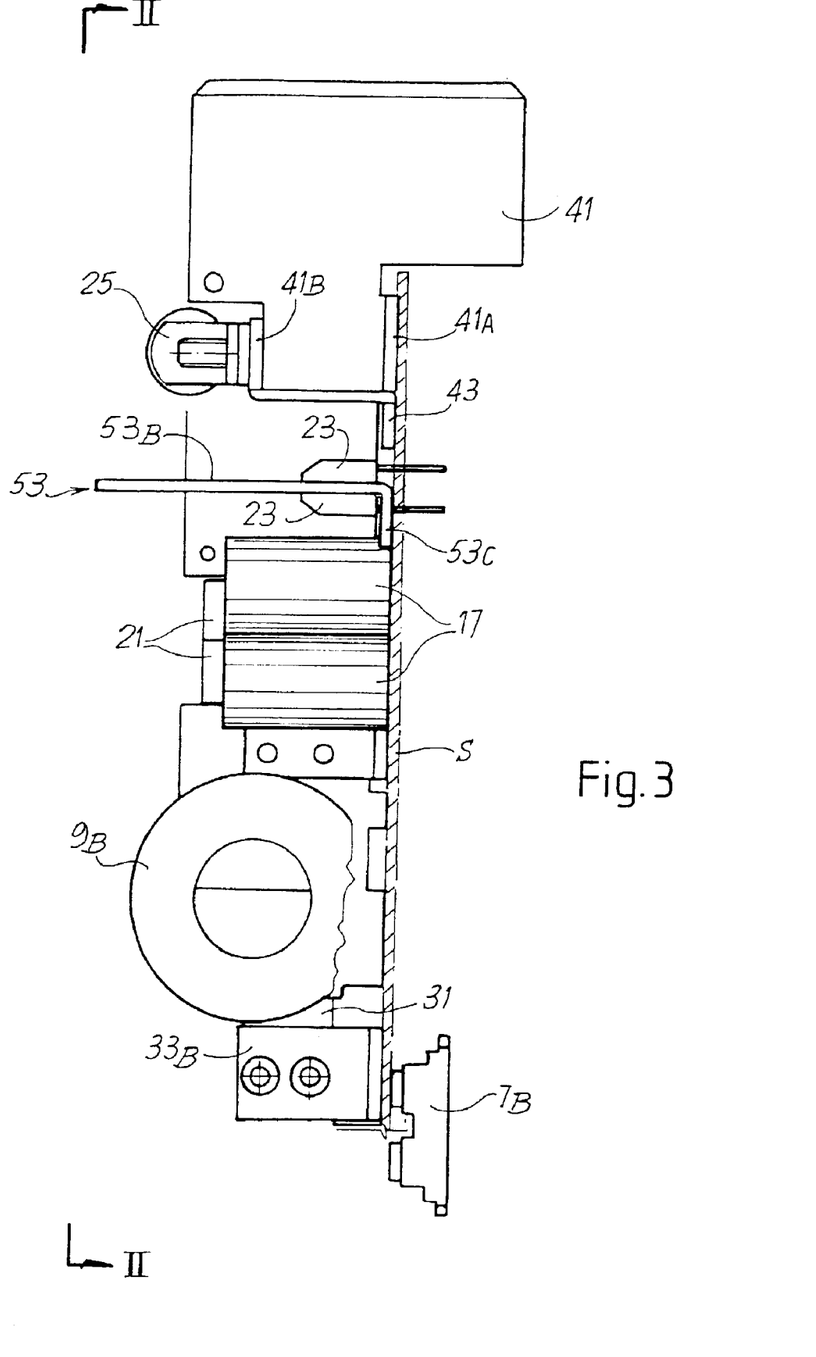
FIGS. 3 and 4 illustrate side views according to the planes indicated by III—III and IV—IV of FIG. 2.
Figure 4:
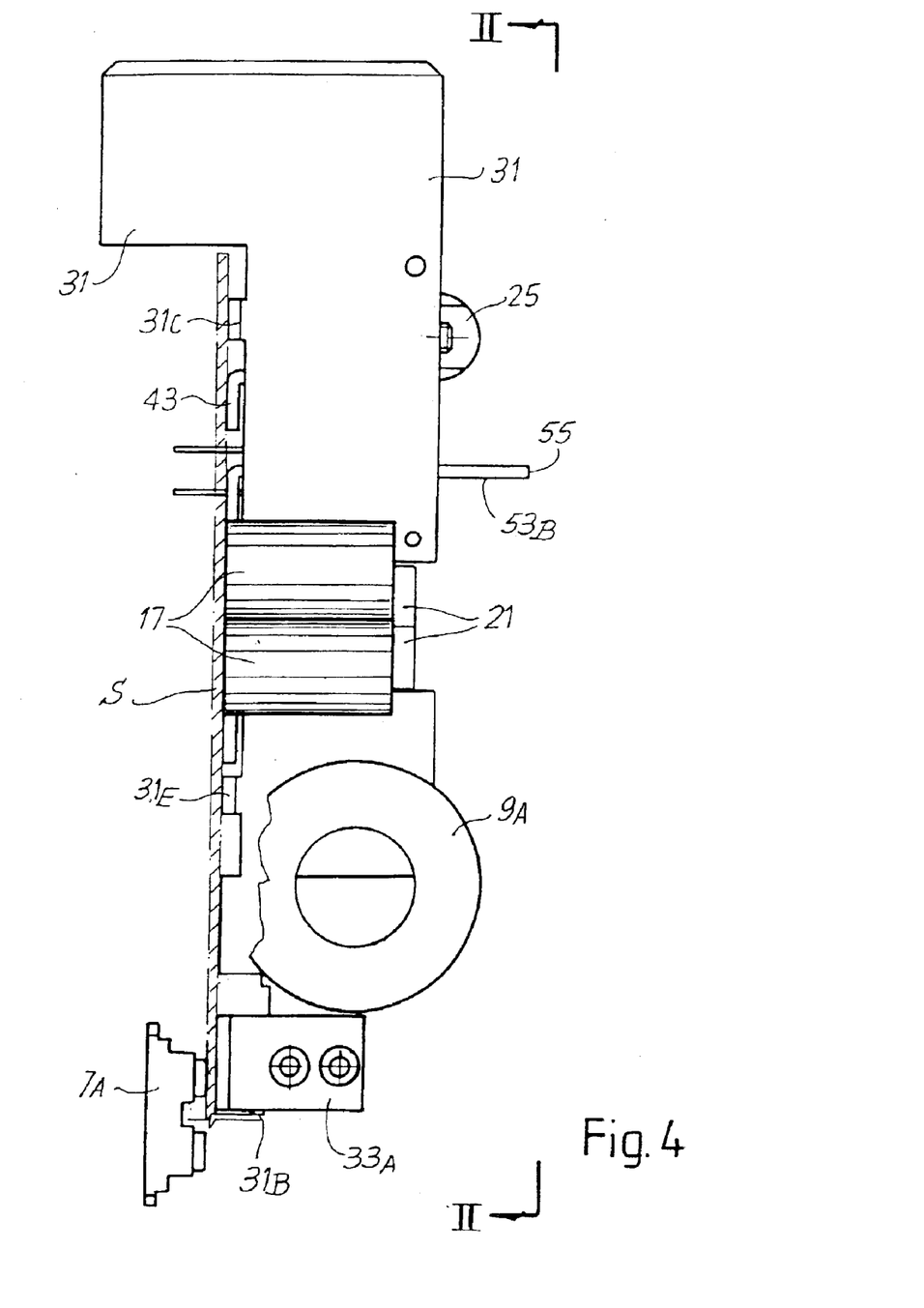
Figure 5:
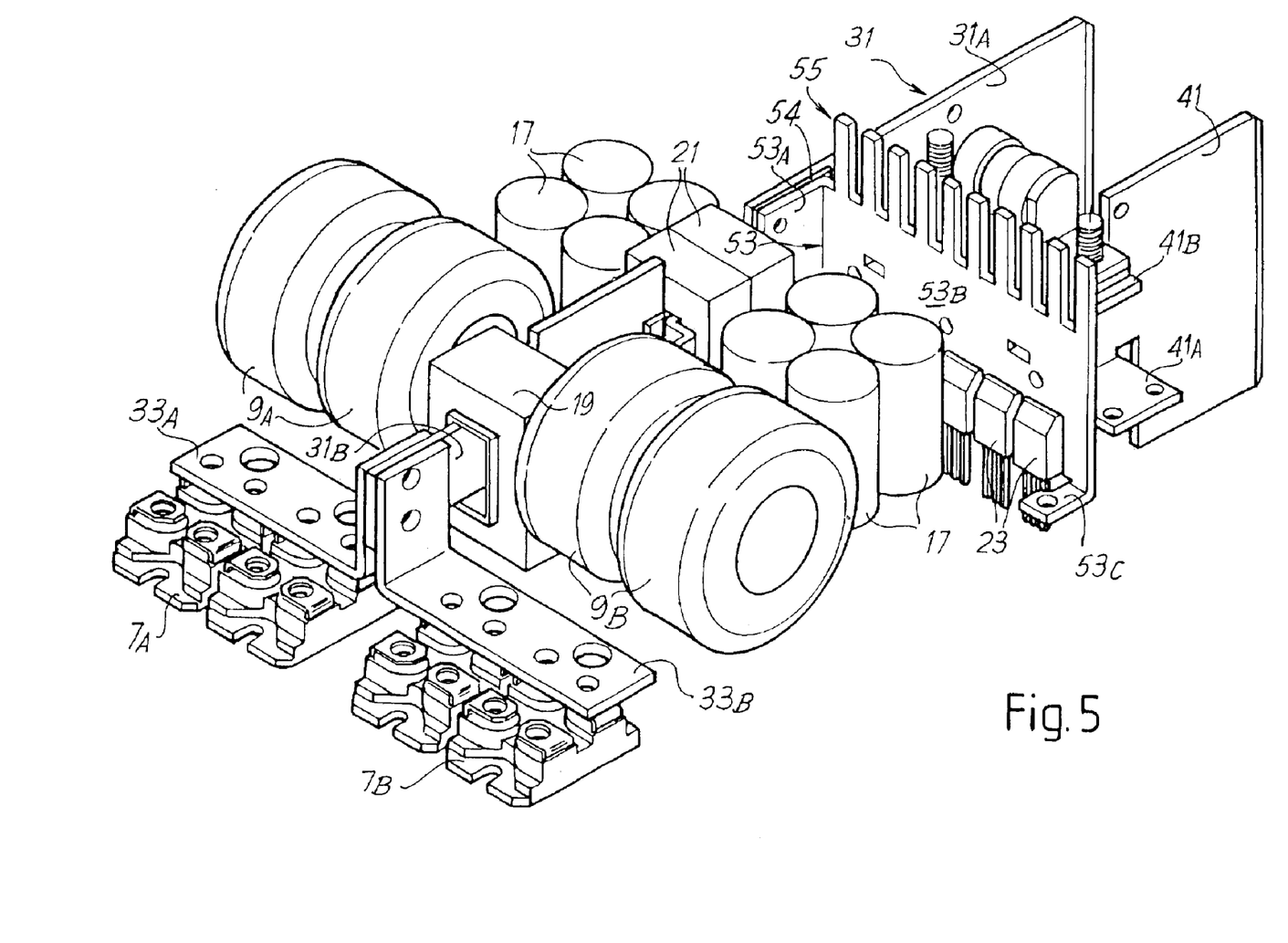
FIG. 5 illustrates a perspective view of the components illustrated in FIGS. 2, 3 and 4.
Figure 6:
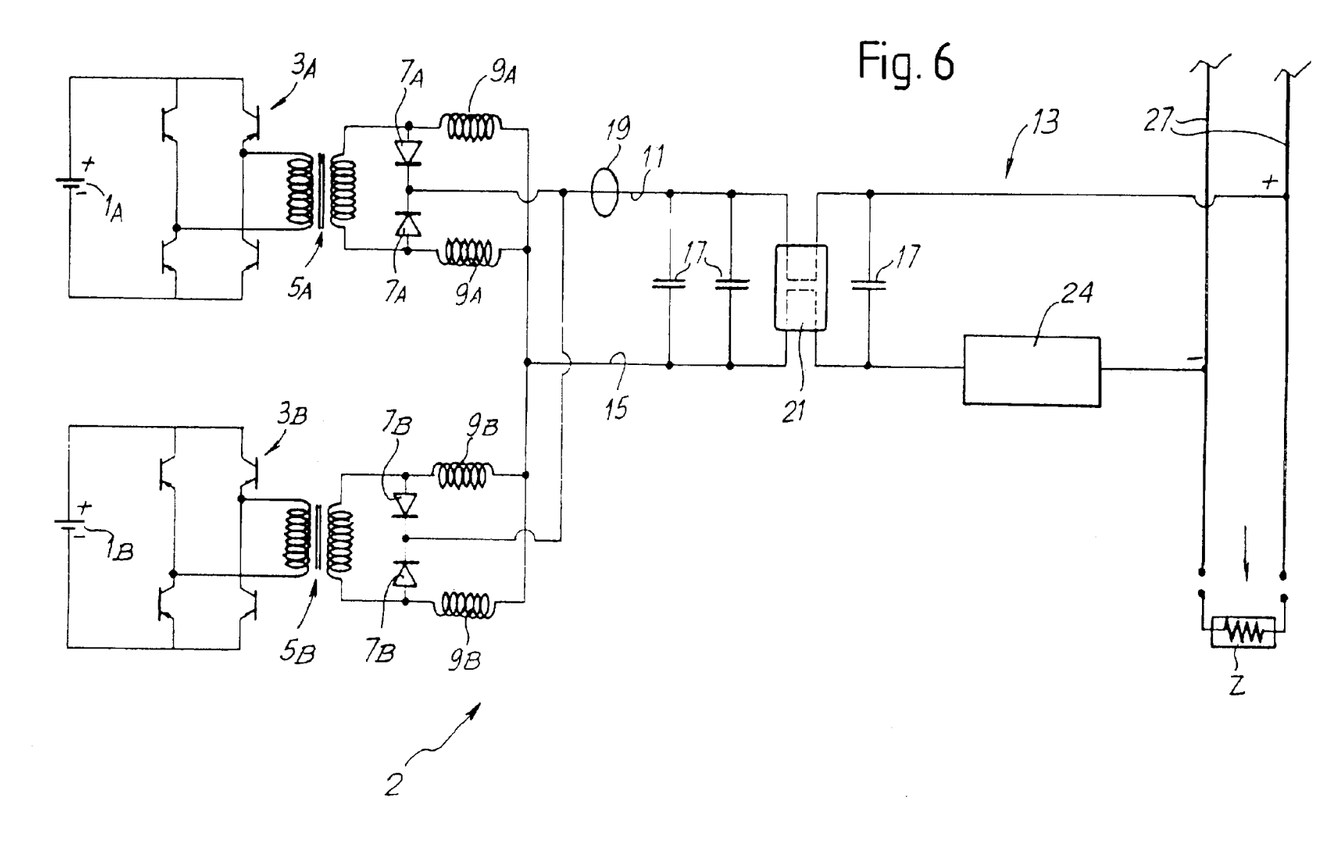
FIG. 6 illustrates a simplified circuit diagram of a second embodiment of the power supply.

One first embodiment of the power supply of the present invention is represented in FIGS. 1 to 5. FIG. 1 reproduces a simplified diagram of a power supply 2, which, in the example illustrated, has two rectifiers set in parallel. On the other hand, it is to be understood that the concept underlying the present invention can be implemented also with a power supply having a single rectifier.

The reference numbers 1A and 1B indicate as a whole the DC voltage sources at input to the rectifiers. The reference numbers 3A and 3B designate as a whole the switches in bridge configuration; whilst 5A and 5B designate the output transformers of each rectifier. Each rectifier has two output diodes 7A and 7B, respectively, and two output chokes 9A and 9B. The rectifiers are connected in parallel and hence the two pairs of output diodes 7A, 7A and 7B, 7B are connected to the positive side 11 of an output line, designated as a whole by 13 and of which the reference number 15 designates the negative side.

The negative of the output line 13 is connected to the output chokes 9A, 9A and 9B, 9B. The reference number 17 designates output capacitors set in parallel with respect to one another between the positive 11 and the negative 15 of the output line 13. The reference number 19 designates a current sensor, typically a Hall sensor, set on the positive side 11 of the output line 13. The reference number 23 designates an arrangement of MOSFETs set in parallel, with a control operational amplifier, which constitute means for interrupting the supply in the event of failure in one or other of the rectifiers set in parallel. Finally, the reference number 25 designates a protection fuse.

The line 13 is connected to a bus 27 for supplying a load Z supplied by a plurality of electric-power supplies similar to the power supply 2 briefly described above, said power supplies being connected to one another in parallel on the supply bus 27.

FIGS. 2 to 5 illustrate the arrangement of some of the electronic components and of the electrical and mechanical connection constituted by the output boards or bars of the power supply. The transformers 5A and 5B of the rectifiers set in parallel and all the components upstream of the transformer itself are not shown. Represented, instead, are the output diodes 7A, 7B, the output chokes or coils 9A and 9B, the Hall sensor 19, the output capacitors 17, the common choke 21, the means for interrupting the supply 23, and the fuse 25. The diodes 7A, 7B, the chokes or coils 9A, 9B, the capacitors 17, and the interruption means 23 are carried by the electronic card designated as a whole by S in FIGS. 3 and 4 and omitted in the remaining figures. The electronic card S also carries the other electronic components, which are not described herein since they are in themselves known.

The Hall sensor 19 is mounted on one first board or bar 31 made of electrically conductive material, which develops in a plane substantially orthogonal to the plane of lie of the electronic card S. The bar 31 forms the positive side or pole 11 of the output line 13 (see the diagram of FIG. 1). The output end 31A is designed to be electrically connected to the bus 27 for supplying the load Z. The first bar 31 develops in a rectilinear direction from the output end 31A up to one opposite end 31B, which is located in the proximity of the output diodes 7A, 7B of the rectifiers.

The bar 31 is constrained, in an area corresponding to its own end 31 B, to two brackets 33A and 33B, which are clamped on the electronic card S. The brackets 33A and 33B provide the electrical connection and the mechanical connection with the electronic card S and the components mounted thereon, in particular with the output diodes 7A, 7B. Along its own longitudinal development, the first bar 31 has folded appendages 31C, 31D and 31E, which constitute further points of mechanical connection with the electronic card S. The negative pole of the output line 13 of the power supply is physically constituted in part by a second bar 41, which has one first folded appendage 41A for mechanical connection to the electronic card S and one second folded appendage 41B for electrical and mechanical connection to the fuse 25. Also the bar 41, like the bar 31, develops in a plane orthogonal to the plane of lie of the electronic card S except, obviously, for the appendages 41A and 41B, which are substantially parallel to the plane of lie of the electronic card S.

The fuse 25 is electrically and mechanically connected to one bracket 43, which is in turn constrained mechanically and electrically to the electronic card S.

Mechanically constrained to the first bar 31 is a third bar 53, which is shaped and has various stretches or portions that are mutually orthogonal, all lying in planes orthogonal to the plane of lie of the electronic card S. More in particular, the third bar 53 has an intermediate portion 53A parallel to the first bar 31 and set alongside an intermediate stretch of the latter, with the interposition of a layer of insulating material 54. The two bars 31 and 53 are mechanically connected to one another in an area corresponding to this intermediate stretch 53A of the third bar 53. Developing and set around the intermediate stretch 53A of the bar 53 is the output common choke or coil 21, which in this way surrounds the two bars.

The third bar 53 further has a portion 53B orthogonal to the stretch 53A parallel to the first bar 31. The portion 53B has, along its own top edge, a toothing 55 and forms therewith a heatsink. The portion 53B forming the heatsink is in mechanical and electrical connection with the MOSFETs 23 forming the means for interrupting the supply, and moreover has an appendage 53C which, together with a further appendage 53D, has the function of mechanical connection and possibly electrical connection with the electronic card S.

Finally, the third bar 53 has a terminal portion 53E, opposite to the portion 53B, which forms, with its own toothing 55, the heatsink, and which is mechanically and electrically connected to brackets 57A and 57B, which in turn provide a further electrical and mechanical connection to the electronic card S.

While the positive side 11 of the output line 13 of the power supply is formed integrally from the first bar 31, which extends from the end 31A to the end 31B, the negative side 15 of the output line 13 comprises the brackets 57A, 57B, the third bar 53, the bracket 43, the fuse 25, and the bar 41.

With this configuration, the assembly of the power supply proves highly simplified. In fact, on the electronic card S are mounted, using any known technique that is suitable for the purpose, all the electronic, logic and power components, including the coils or chokes 9A, 9B, the capacitors 17, the MOSFETs 23 or other equivalent means of interruption of the supply, the output diodes 7A, 7B, and all the components forming the rectifiers. The following components are assembled separately together: the first bar 31, the third bar 53, the output coils or chokes 21, and the Hall sensor 19. The brackets 57A, 57B and 33A, 33B can be coupled to this ensemble of components. Alternatively, the above four brackets can be mounted separately on the electronic card S.

Then, the bar 31 is applied on the electronic card S with all the elements mechanically constrained thereto, as well as possibly the brackets 33A, 33B, 57A, 57B. All the above is fixed mechanically on the electronic card S by means of the appendages 31C, 31D, 31E, the brackets 33A, 33B, 57A, 57B, and the appendages 53C and 53D.

Assembled together separately are the second bar 41, the fuse 25 and possibly the bracket 43. This ensemble of elements is then mounted on the electronic card S as a single block by means of the appendage 41A and the bracket 43. The latter may possibly be mounted on the electronic card S separately with respect to the fuse 25 and to the bar 41.

FIGS. 6 to 9 illustrate a different embodiment of the power supply according to the invention. Numbers that are the same designate parts that are the same or equivalent to the ones of the preceding embodiment. As may be seen in particular in FIG. 6, from a circuitry point of view, the second embodiment differs from the first one by the presence of a circuit breaker instead of the fuse 25 and by the interruption means 23 constituted by the arrangement in parallel of MOSFETs. The circuit breaker, designated by 24, can be reset after it has tripped, for example on account of an overcurrent.

The concept according to which wiring of this embodiment is performed is substantially similar to the foregoing, as may be inferred from FIGS. 7 and 8, where once again numbers that are the same designate parts that are the same or correspond. This example differs from the preceding one as regards the conformation of the second bar 41 and the third bar 53. The second bar 43, which once again forms one of the two output poles of the power supply, has a portion orthogonal to the plane of lie of the electronic card S and constituted by three mutually orthogonal plane segments. One appendage 41A is used for application to the electronic card 8, whilst a portion parallel to said card, designated by 41B, is used for mechanical and electrical connection to the electronic circuit breaker 24. The latter is housed in an opening of the electronic card and projects partly above and partly below the electronic card S itself.

Figure 7:
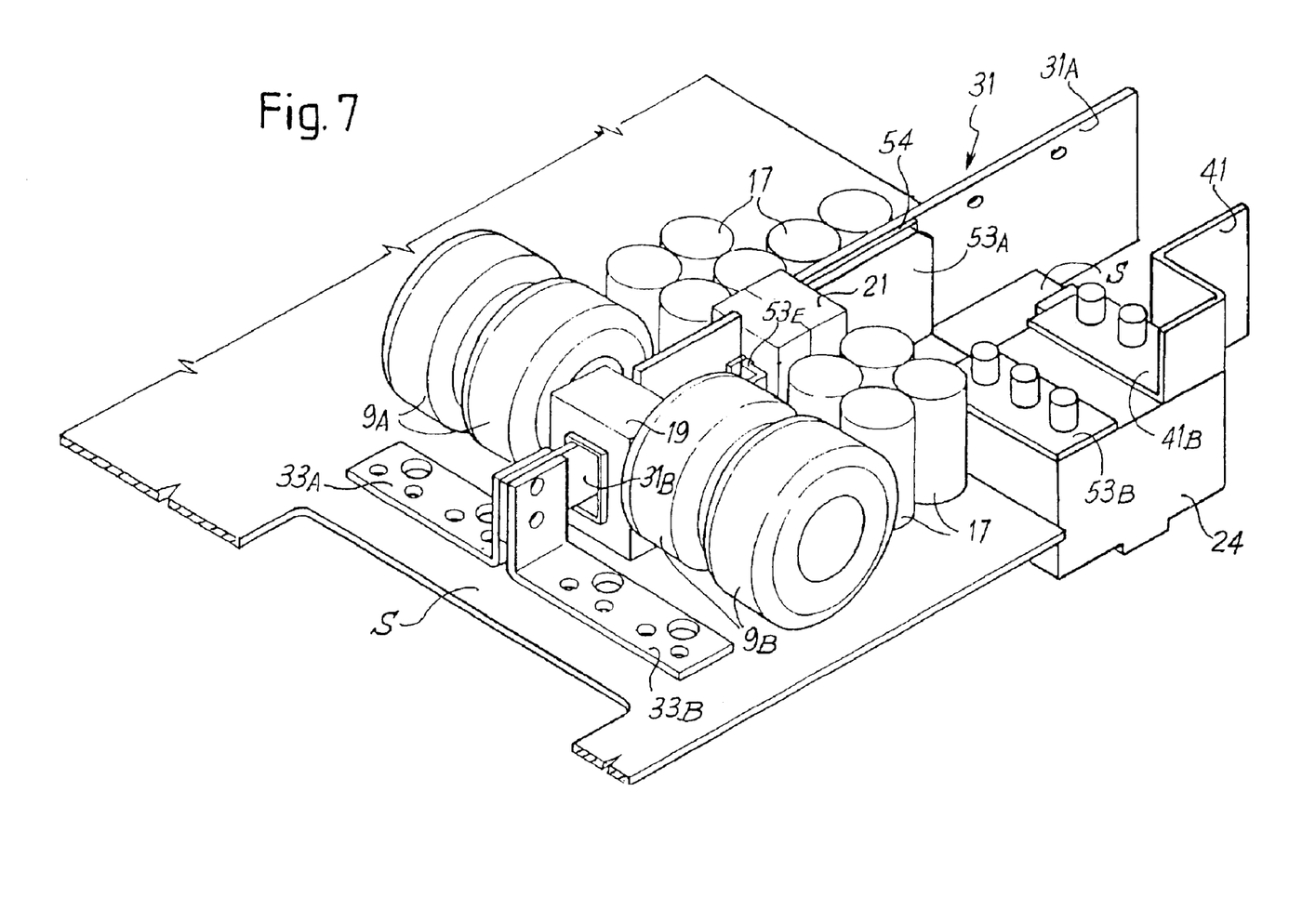
FIG. 7 illustrates a perspective view of the power supply according to the second embodiment.
Figure 8:
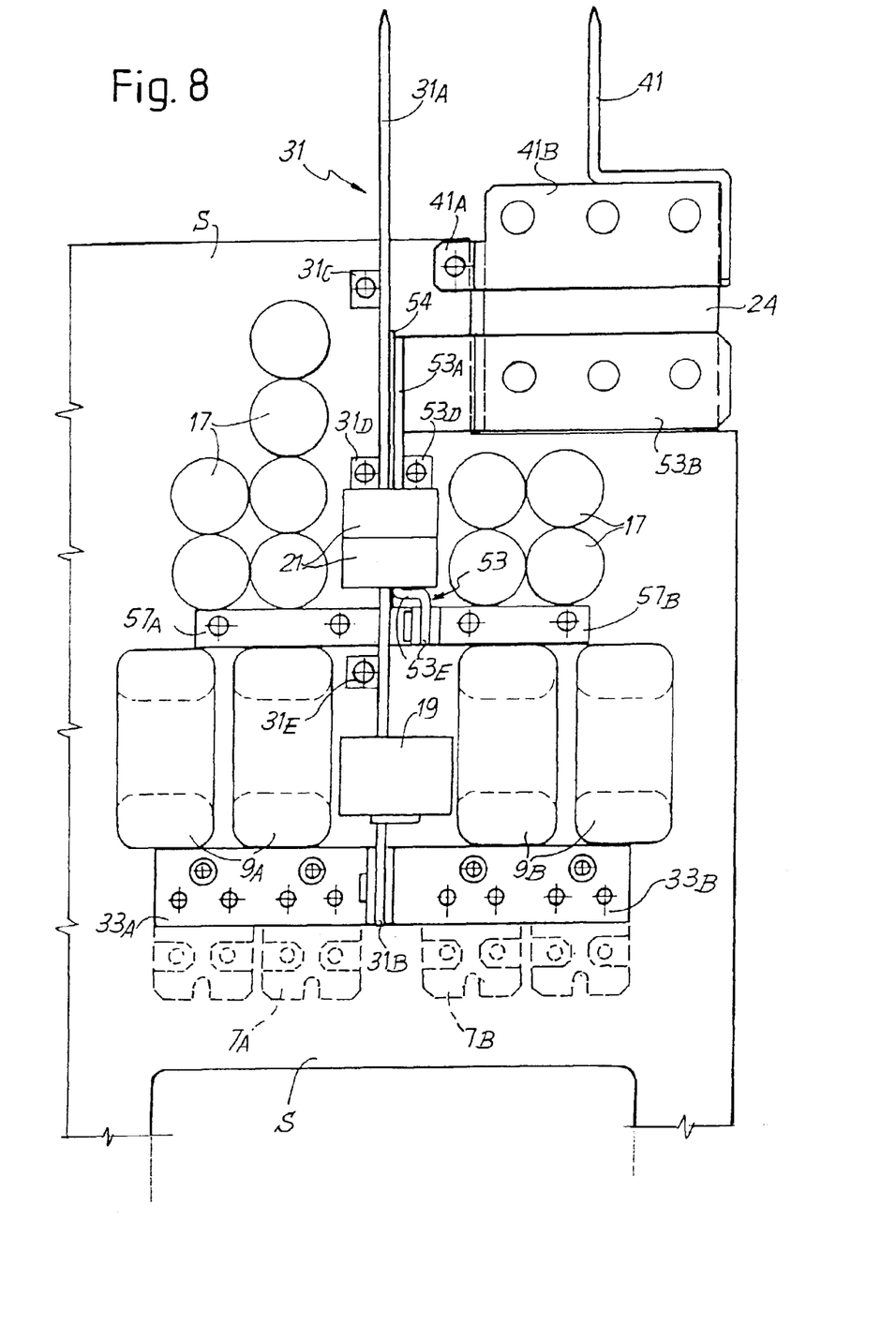
FIG. 8 illustrates a plan view of the power supply of FIG. 7.

The third bar, once again designated by 53, has a portion 53A parallel to the first bar 31 and around which the common output choke 21 is wound. A second portion 53B of the bar 53 is used for mechanical and electrical connection to the circuit breaker 24.

Figure 9:
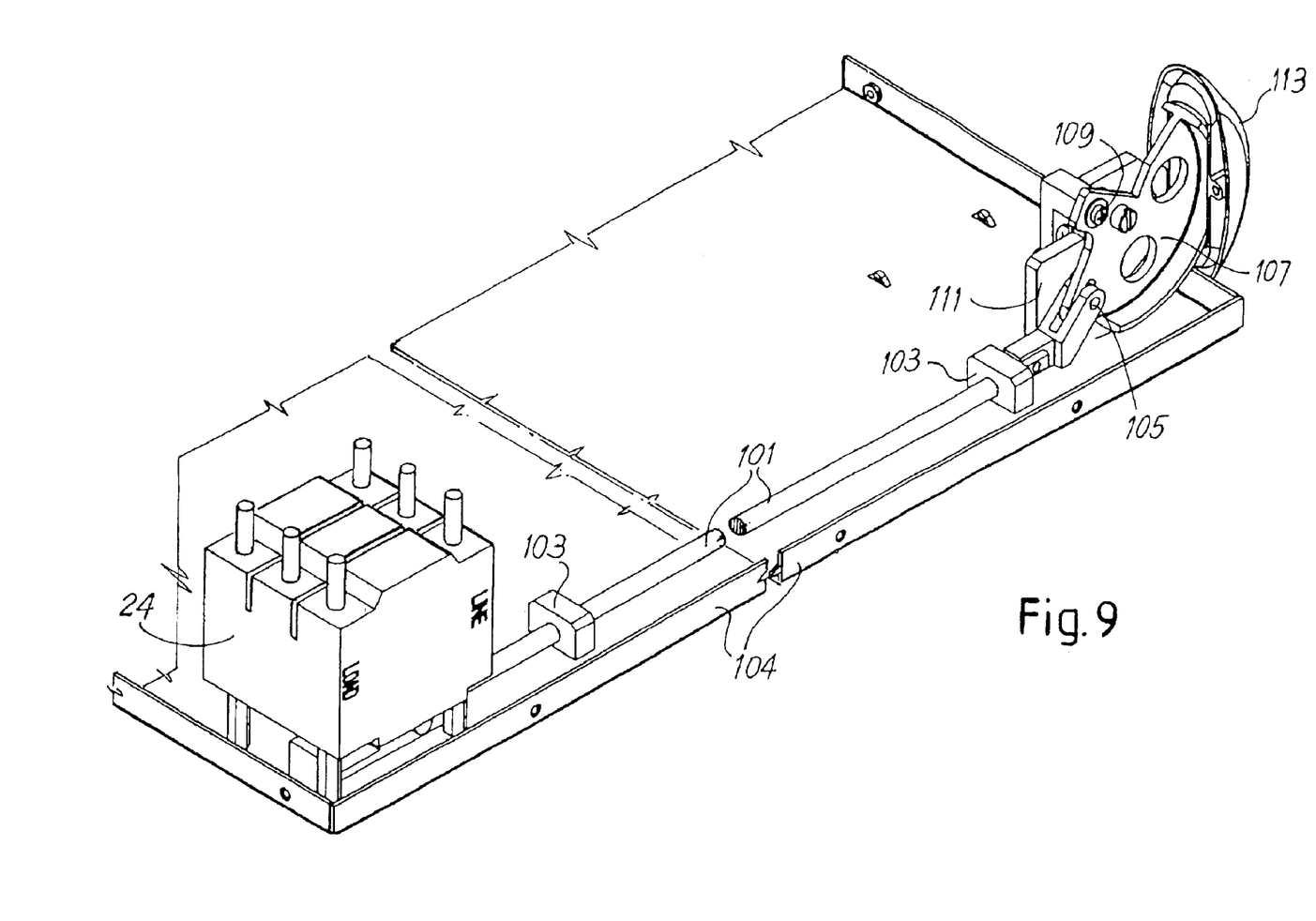
FIG. 9 illustrates the device for resetting the circuit breaker of FIGS. 6 and 7.

FIG. 9 is a schematic illustration of the mechanism for resetting the circuit breaker 24. The electronic card S and the components mounted thereon have been removed for reasons of clarity of representation. The mechanism for resetting the circuit breaker 24 comprises a rod 101 guided within two guides 103 fixed on the base 104 of the container of the power supply, whose remaining portions being omitted for reasons of clarity of representation. The end of the bar 101 opposite to the end constrained to the circuit breaker 24 is hinged in 105 to a crank 107. The latter is hinged in 109 to a support 111 constrained to the base 104 and has a gripping surface 113 projecting from the container of the power supply, which is accessible from the front side thereof. By means of the surface 113 the operator can thus intervene to reset the circuit breaker 24 without any need for disassembly.

It is understood that the drawings only illustrate an example provided by way of practical demonstration of the invention, it being possible for the invention to vary in the embodiments and arrangements without thereby departing from the scope of the underlying idea.

Thus, although there have been described particular embodiments of the present invention of a new and useful Electric-Power Supply with Rectifier, it is not intended that such references be construed as limitations upon the scope of this invention except as set forth in the following claims.

What is claimed is:

1. An electric-power supply comprising an electronic card with at least one rectifier and one output line of said rectifier, characterized in that the output line comprises at least one first bar made of conductive material, terminating with one first output end, and at least one second bar made of conductive material, terminating with one second output end, said first and second output ends forming positive and negative output poles of the power supply for connection to a load, means for electrical and mechanical connection being provided for said first and second bars to said card, and on least one of said two bars there is carried at least one electronic component of said rectifier.

2. The power supply according to claim 1, characterized in that said first and said second bars develop on planes orthogonal to said card.

3. The power supply according to claim 1 wherein said first bar extends from its own output end up to output diodes of said rectifier.

4. The power supply according to claim 3 wherein said first bar is constrained to at least one first bracket for mechanical and electrical connection to said output diodes.

5. The power supply according to claim 1 wherein said first bar carries a current sensor.

6. The power supply according to claim 5, said current sensor comprising a Hall sensor.

7. The power supply according to one claim 1, further comprising a third bar made of conductive material, the third bar electrically connected to the second bar.

8. The power supply according to claim 7, said third bar is mechanically connected to the first bar, and further comprising a common choke of said rectifier set positioned along one another of the first bar and of the third bar.

9. The power supply according to claim 8 wherein said third bar is constrained to at least one bracket for mechanical and electrical connection to said card.

10. The power supply according to claim 9, wherein said at least one bracket for connection of the third bar to the card connects the third bar electrically to output capacitors of the rectifier.

11. The power supply according to claim 9 wherein said third bar is in electrical and mechanical connection with means for electrically interrupting the power supply.

12. The power supply according to claim 11 wherein said third bar has a portion forming a heat sink.

13. The power supply according to claim 12, said heat sink formed by a toothing along an edge of said portion of the third bar.

14. The power supply according to claim 13, said first bar and said third bar being mechanically constrained together in an area corresponding to two planar stretches positioned alongside one another with the interposition of a layer of insulating material.

15. The power supply according to claim 14 wherein said heat sink portion of the third bar is substantially orthogonal to said planar stretch thereof in an area corresponding to which the third bar is connected mechanically to the first bar.

16. The power supply according to claim 14, said common choke positioned around said two planar stretches of the first bar and of the third bar.

17. The power supply according to claim 1, the second bar carrying an output fuse electrically connected thereto and to said card.

18. The power supply according to claim 17 wherein said fuse is electrically and mechanically connected to said card by means of at least one respective bracket.

19. The power supply according to claim 11, characterized in that said means for interrupting the supply is positioned between said second bar and said third bar.

20. The power supply according to claim 19, said means for interrupting the supply comprising a circuit breaker.

21. The power supply according to claim 20 further comprising a reset mechanism for resetting circuit breaker, said reset mechanism accessible from a front side of the power supply.

22. The power supply according to claim 21 wherein said circuit breaker is mounted in an aperture of the card and projects above and below the card, said bars being mounted on one face of the card, and said reset mechanism is located on an opposite face of the card.

23. The power supply according to claim 21, said reset mechanism comprising a rod and a crank.

24. The power supply according to claim 23, said first bar comprising a rectilinear development from the output end to the connection with the output diodes of the rectifier.

* * * * *